United States Patent
King

(10) Patent No.: US 7,474,098 B2
(45) Date of Patent: Jan. 6, 2009

(54) STACKED COIL ARRAY FOR MAGNETIC RESONANCE EXPERIMENTS

(75) Inventor: Scott King, Winnipeg (CA)

(73) Assignee: National Research Council of Canada, Ottawa, Ontario (CA)

(*) Notice: Subject to any disclaimer, the term of this patent is extended or adjusted under 35 U.S.C. 154(b) by 22 days.

(21) Appl. No.: 10/564,781

(22) PCT Filed: Jul. 23, 2004

(86) PCT No.: PCT/CA2004/001075
§ 371 (c)(1),
(2), (4) Date: Apr. 19, 2007

(87) PCT Pub. No.: WO2005/012931

PCT Pub. Date: Feb. 10, 2005

(65) Prior Publication Data
US 2008/0042648 A1 Feb. 21, 2008

(51) Int. Cl.
*G01V 3/00* (2006.01)
(52) U.S. Cl. ............ 324/318; 324/322; 600/422
(58) Field of Classification Search .......... 324/318, 324/322; 600/422
See application file for complete search history.

(56) References Cited

U.S. PATENT DOCUMENTS

| | | | |
|---|---|---|---|
| 4,812,761 A | 3/1989 | Vaughan, Jr. | |
| 4,839,595 A * | 6/1989 | Boskamp | 324/318 |
| 5,256,971 A | 10/1993 | Boskamp | |
| 5,471,142 A * | 11/1995 | Wang | 324/318 |
| 5,548,218 A * | 8/1996 | Lu | 324/318 |
| 5,689,189 A | 11/1997 | Morich et al. | |
| 5,929,639 A | 7/1999 | Doty | |
| 6,300,761 B1 * | 10/2001 | Hagen et al. | 324/318 |
| 6,914,432 B2 * | 7/2005 | Dumoulin et al. | 324/318 |
| 7,348,778 B2 * | 3/2008 | Chu et al. | 324/318 |
| 2003/0038632 A1 | 2/2003 | Duensing et al. | |

(Continued)

OTHER PUBLICATIONS

Okamato K. et al "Torso Array Coil with Eight QD-Surface Coils for Parallel Imaging" Proceedings of the International Society for Magnetic Resonance in Medicine, Tenth Meeting Proceedings, May 18, 2002 XP 002306835 Honolulu HI USA.

(Continued)

*Primary Examiner*—Louis M Arana
(74) *Attorney, Agent, or Firm*—Adrian D. Battison; Ade & Company Inc.

(57) ABSTRACT

An array coil for sensing signals in magnetic resonance experiments incorporates the traditional loop-butterfly array elements at spaced positions along an axis of the sample with additional stacked twisted loops and/or twisted butterfly elements. The twisted loop and twisted butterfly elements are centered along between the standard loop-butterfly array elements. The twisted array elements are naturally isolated from both the loop and butterfly. Alternatively, for a two dimensional mesh array of loop elements, additional twisted loop array elements are added with both longitudinal and transverse orientations, again centered between loop elements. The goal is to allow separation of loop and/or butterfly elements of linear (Spine), 2D planar arrays (Cardiac) or cylindrical arrays of curved array elements (Head), for improved parallel MRI capabilities such as the SENSE or SMASH techniques, but to recover the SNR lost in between the elements and improve the g-factor of the total array with additional orthogonal array elements.

11 Claims, 9 Drawing Sheets

U.S. PATENT DOCUMENTS

| | | |
|---|---|---|
| 2003/0094948 A1 | 5/2003 | Okamoto et al. |
| 2003/0132750 A1 | 7/2003 | Machida et al. |
| 2004/0000908 A1 | 1/2004 | Molyneaux et al. |
| 2004/0196042 A1 | 10/2004 | Fujita et al. |

OTHER PUBLICATIONS

Fujita H. Spence D.K. "A Novel 8-Channel "Saddle-Train" Array Coil for Cardiac Sense Iamging at 1.5T" Proceedings of the International Society for Magnetic Resonance in Medicine, Tenth Meeting Proceedings, May 18, 2002 XP002306836 Honolulu, HI USA.

* cited by examiner

Fig. 9

STACKED COIL ARRAY FOR MAGNETIC RESONANCE EXPERIMENTS

This invention relates to surface or volume array coil designs for Magnetic Resonance Imaging (MRI) and Spectroscopy (MRS) using a plurality of coil elements which are tuned to a common frequency for simultaneous parallel reception of signals from a sample to be tested or alternatively in transmission for excitation of a sample to be tested.

The coil arrays disclosed and claimed herein are primarily designed as sensing coils for detecting signals from the sample but can be used as field generating coils or as both sensing and generating coils as required. It will be appreciated that such coils which include de-coupled components are both de-coupled in respect of a field generated from an input signal and noise received in the signal from the sample and the description hereinafter may refer to either.

Surface and volume coils are used for magnetic resonance experiments including both magnetic resonance imaging (MRI) and magnetic resonance spepctroscopy (MRS).

Presently, surface loop coils are used to produce a certain optimum signal-to-noise ratio (SNR) at a particular depth of interest within a sample. The dimension and geometry (square, circular, hexagonal, rectangular or diamonds) of the loop element is optimised for that depth and generally it turns out that the dimensions of the coil, in the plane at right angles to the depth, are equal to the optimized depth.

A second element known as a "butterfly" element can be used independently in replacement for the single loop or more preferably can be added on top of the loop. Provided this uses the same coil dimensions, the optimized depth will also be the same.

A butterfly is a compound coil element formed from two coil sections side by side and connected such that one is twisted relative to the other so that the current runs in the opposite direction around the coil sections to generate for the coil sections a field in the opposite direction relative to the plane of the coil. The two sections are equal and opposite.

Rather than analyze the resultant signals from the loop and butterfly independently they are preferably combined into a single channel using an optimised combiner to increase the SNR at the depth of interest typically by 20%-30%. This is because the loop and butterfly are naturally isolated (de-coupled) from each other so that no noise correlation exists. This gives rise to the well-known quadrature SNR gain. For that depth of interest, this technique is thought to maximize the SNR for a single channel.

No other "stacking" of additional array elements was thought of to increase SNR at the depth of interest.

To increase field of view (FOV) in a longitudinal direction of a sample, such as a spine, additional coil elements are placed along the long axis and fed into separate receivers. These coil elements are preferably the inductively decoupled loop-butterfly array combinations described above but may be formed solely by a conventional loop or solely by a butterfly as required. The longitudinal direction may be coincident with the z axis (z-axis here defined as B0-field direction) of a cylindrical-solenoidal MRI magnet as typically would be the case for the spine imaging or may be transverse to the z axis, either at right angles thereto or diagonally at an angle thereto.

The coil elements are thus arranged side by side along a longitudinal direction of the sample to be tested so as to define a line transverse to the longitudinal direction which is at the junction between the first and second coil elements. The junction at the transverse line can be provided by an overlap but is generally more preferably defined by a space between the combined array elements. Recent parallel MRI research into SENSE/SMASH optimized phased array designs has shown that the ability of an array coil to unwrap Nyquist folded MR images due to under-encoded k-space data is improved if neighbouring array elements are separated as opposed to overlapped. That is, there is a measure of image wrap artefact, the so called g-factor, that describes an array-coil's ability to unwrap under-encoded MR images. Generally, the g-factor is greater than 1 (the optimum value being 1 over the entire imaging plane). It has been found that the g-factor is reduced and closer to its optimum value of 1 for spaced array elements relative to overlapped array elements.

It is known that the SNR is disadvantageously reduced in between the array elements in the long dimension at the transverse line where the junction occurs. This is related to the SNR falloff of the individual array elements. Closing the gap between array elements or overlapping the array elements may reduce this fall-off but is clearly disadvantageous because it reduces the ability to unwrap under-encoded images collected using parallel imaging methods since it increases the G-factor.

A surface array has been published in M. Ohliger, R. Greenman, C. A. McKenzie, D. K. Sodickson, Concentric Coil Arrays for Spatial Encoding in Parallel MRI, Proc. Intl. Soc. Mag. Reson. Med. 9 (2001) #21. that does provide SNR gain nearer to the surface and may provide parallel imaging benefits, but does not significantly increase SNR at the depth of interest significantly. The problem with this design is that naturally decoupled array elements were made by decreasing the sizes of the constituent parts.

There is always a need for the best possible SNR at a particular depth within the sample. As mentioned above the present solutions still maintain the same maximum SNR at a particular depth.

SUMMARY OF THE INVENTION

An object of the present invention is to provide a new design for an array coil that improves the homogeneity and SNR at a desired depth of MRI and MRS while allowing an improvement in G-factor.

According to the invention, therefore, there is provided a coil array for use in magnetic resonance experiments on a sample to be tested comprising:

a plurality of coil elements tuned to a common frequency for simultaneous parallel reception of signals from a sample to be tested or alternatively in transmission for excitation of a sample to be tested;

the coil elements including a first and a second coil elements each having coil dimensions selected and arranged to provide for the coil elements a predetermined depth from the coil of optimum operation within the sample to be tested;

the first and second coil elements being placed side by side along a longitudinal direction of the sample to be tested so as to define a line transverse to the longitudinal direction which is at the junction between the first and second coil elements;

the coil elements including a third coil element having a first coil section, a second coil section and a third coil section arranged such that:

the first coil section is arranged at a location bridging the transverse line;

the second coil section is arranged at a side of the first coil section remote from said transverse line and the third coil section is arranged at a side of the first coil section remote from said transverse line and opposite to said second coil section;

the first coil section has coil dimensions selected and arranged to provide for the first coil section a depth from the coil of optimum operation within the sample to be tested substantially equal to the predetermined optimum depth of the first and second coil elements;

the second and third coil sections are twisted relative to the first coil section and arranged such that the current therein rotates in direction opposite to that of the first coil section;

the third coil element being dimensioned and arranged such that it is de-coupled from the first and second coil elements.

In order to provide the decoupling of the third coil element geometrically, it is preferable that the second and third coil sections are dimensioned in the longitudinal direction such that the sum of the lengths of the first, second and third coil sections is substantially equal to the sum of the lengths of the first and second coil elements in the longitudinal direction.

However conventionally known decoupling techniques such as shared inductance or shared capacitance well known to one skilled in the art can be used to supplement geometrical techniques if the geometry is compromised due to the particularly design of the coil elements.

The term "longitudinal direction" as used herein is not intended to limit the construction defined to one where the direction is aligned with the z-direction of the magnet. Instead the direction concerned may be in the x-direction or at an angle to the z direction so as to be diagonal.

While the defined structure set forth above mentions only one pair of such coils arranged in the longitudinal direction, the same construction includes further coils arranged either in the same longitudinal direction or arranged in an array extending in two directions at an angle to one another, generally orthogonal but not necessarily so.

The construction may also include parts of the coil array which are not in a common plane with the main part of the coil array. Thus the array may be curved to form a volume coil or the construction may be primarily a surface array defining a particular plane with specific parts of the array deviating from that plane.

The construction may have the first and second coil elements arranged symmetrically about a line extending in the longitudinal direction. However, while this is particularly preferred, it is not essential to the construction and one of the first and second coils may be offset to one side of the longitudinal line to form a diagonal array. In this case, the third coil element may have the first coil section defining the main central lobe which is shaped to follow the shape of the offset first and second coils.

In one arrangement, the first and second coil elements are conventional single loops.

In this arrangement, preferably the third coil element is stacked on the first and second coil elements so as to have substantially the same width along the transverse line and to be substantially aligned therewith.

As an alternative, the first and second coil elements may be conventional butterflies where are each formed from first and second coil sections arranged side by side along the transverse line where the second coil section is twisted relative to the first coil section such that the current therein rotates in direction opposite to that of the first coil section.

Most preferably the array includes fourth and fifth coil elements each in the form of a conventional butterfly stacked on a respective one of the first and second loops respectively where each butterfly is formed from first and second coil sections arranged side by side along the transverse line where the second coil section is twisted relative to the first coil section such that the current therein rotates in direction opposite to that of the first coil section.

As a further alternative, the third coil element may be in the form of a twisted butterfly which is modified to further include a fourth coil section, a fifth coil section and a sixth coil section arranged such that:

the fourth coil section is arranged at a location bridging the transverse line and aligned side by side with the first coil section;

the fifth coil section is arranged at a side of the fourth coil section remote from said transverse line and side by side with the second coil section;

the sixth coil section is arranged at a side of the fourth coil section remote from said transverse line and opposite to said fifth coil section and side by side with the third coil section;

the fourth coil section has coil dimensions selected and arranged to provide for the fourth coil section a depth from the coil of optimum operation within the sample to be tested substantially equal to the predetermined optimum depth of the first and second coil elements;

the fifth and sixth coil sections are dimensioned in the longitudinal direction such that the sum of the lengths of the fourth, fifth and sixth coil sections is substantially equal to the sum of the lengths of the first and second coil elements in the longitudinal direction;

the fifth and sixth coil sections are twisted relative to the fourth coil section and arranged such that the current therein rotates in direction opposite to that of the fourth coil section;

the first, second and third coil sections are twisted relative to the fourth, fifth and sixth coil sections such that the current therein rotates in direction opposite to that of the first, second and third coil sections respectively such that the third coil element is de-coupled from the first and second coil elements.

The geometry set forth above where the coils are arranged to have the same optimum operating depth requires therefore that the first coil section is approximately double the dimension of the second and third coil sections in a direction along the longitudinal axis. This arranges that the total length of the third coil element along the axis is equal to the sum of the first and second coil elements. This dimension may vary from where the first coil section is 50% of the total up to 60% or as little as 40%.

As set forth above, it is preferable that the first and second coils define a gap there between at the transverse line so that there may be a significant gap between the first and second elements. In this case the sum of the lengths of the first, second and third coil sections along the longitudinal direction may vary from the sum of the first and second coil elements in that direction. This may lead to situations where the coils are no longer geometrically decoupled so that the aforementioned additional decoupling techniques may need to be used.

The width of each second and third coil section is preferably equal to the width of the first coil section along the transverse line although this may vary if required for specific decoupling design arrangements.

The first coil section is preferably located so that it centered on the transverse line in a direction along the axis to provide symmetry but this is not essential.

Thus the invention described and claimed herein proposes a new design of array coil that incorporates the traditional loop-butterfly array elements with stacked twisted loops and twisted butterfly elements. The goal is to allow separation of spine elements for improved parallel imaging capabilities such as SENSE and SMASH but to recover the SNR lost in between the elements and improve the g-factor of the total array with additional orthogonal array elements.

The twisted loop and twisted butterfly elements are not centered along the long axis with the loop-butterfly pair, but between the standard loop-butterfly array elements. The dimensions of the twisted array elements are chosen such that they are also naturally isolated from both the loop and butterfly, leading to SNR gain at the depth of interest. SNR gains are achieved at the depth of interest both between the loop-butterfly array elements as well as significant SNR benefits at depth at ends of the array along the long axis. Many higher order twisted array elements can be added that are also naturally decoupled from the loop-butterfly elements, but the SNR benefits of higher order twisted elements are not as significant at the depth of interest. With just adding one twisted loop and one twisted butterfly, long axis SNR gains at the depth of interest of 20%-40% can be achieved between loop-butterfly elements and approximately 35% at the ends of the array for improved z-axis coverage.

An embodiment of the present invention combines stacking the traditional loop-butterfly array elements with twisted loop and twisted butterfly elements. The footprints i.e. the dimensions and the alignment of the twisted elements are chosen such that the elements are decoupled, preferably geometrically, from both the loop and the butterfly, and such that a SNR gain is achieved at the depth of interest. Many higher order twisted array elements can be added that are also naturally decoupled from the loop-butterfly elements. The dimensions can be chosen to produce significant SNR at the depth of interest.

BRIEF DESCRIPTION OF THE DRAWINGS

FIG. 9A illustrates the SNR obtained from a sum-of-squares reconstruction of using only a four element loop-butterfly array as shown in FIG. 1.

FIG. 9B illustrates the SNR obtained from a sum-of-squares reconstruction of using a twisted loop of FIG. 2 and a twisted butterfly of FIG. 3 in addition to the four element loop-butterfly array of FIG. 1 forming a 6 element array.

FIG. 9C illustrates the SNR obtained from a sum-of-squares reconstruction from the 6-element array relative to the standard four element array of FIG. 1.

DETAILED DESCRIPTION OF THE INVENTION

Figure 1:
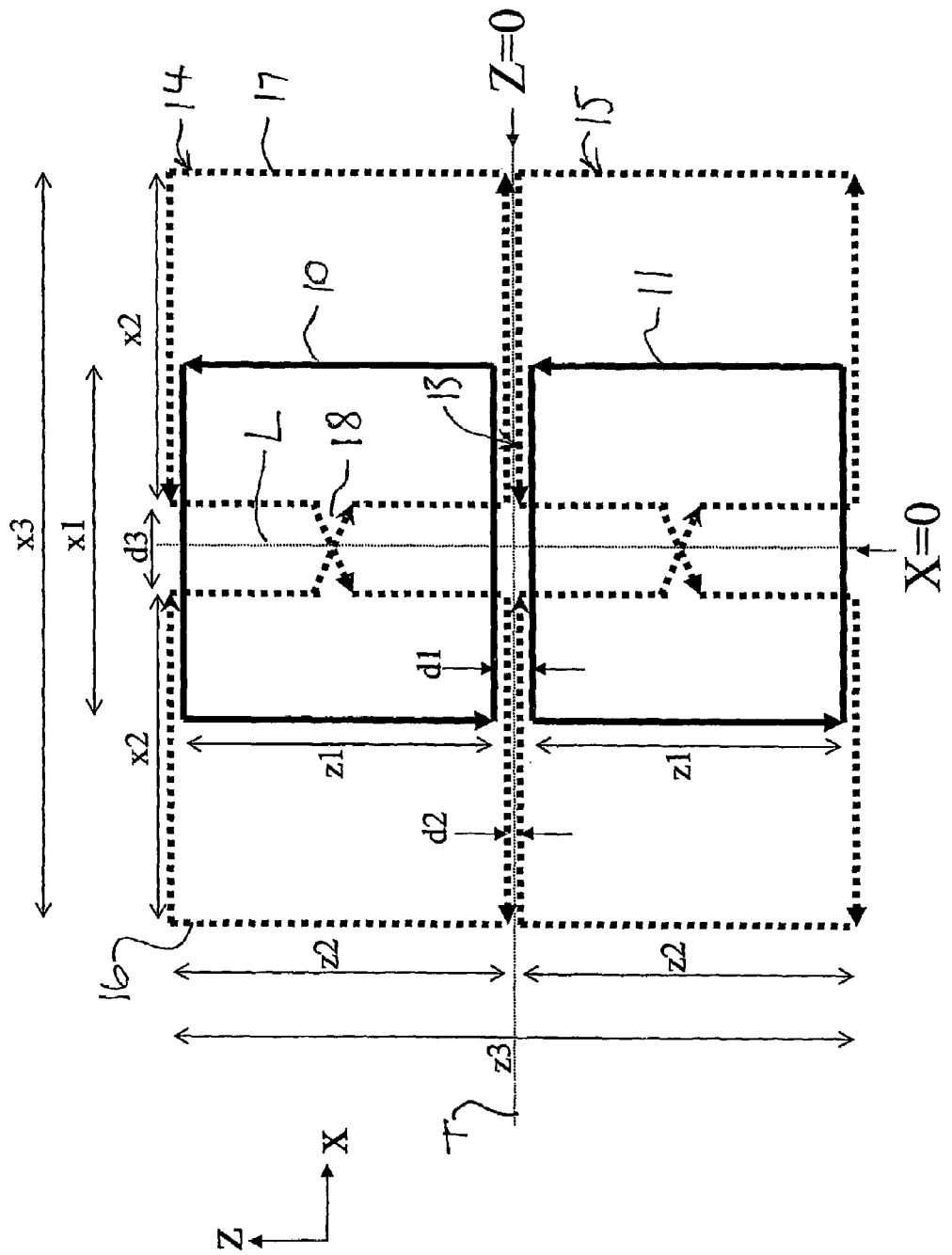
FIG. 1 is a schematic illustration of a loop-butterfly combination layout from the prior art.
Figure 2:
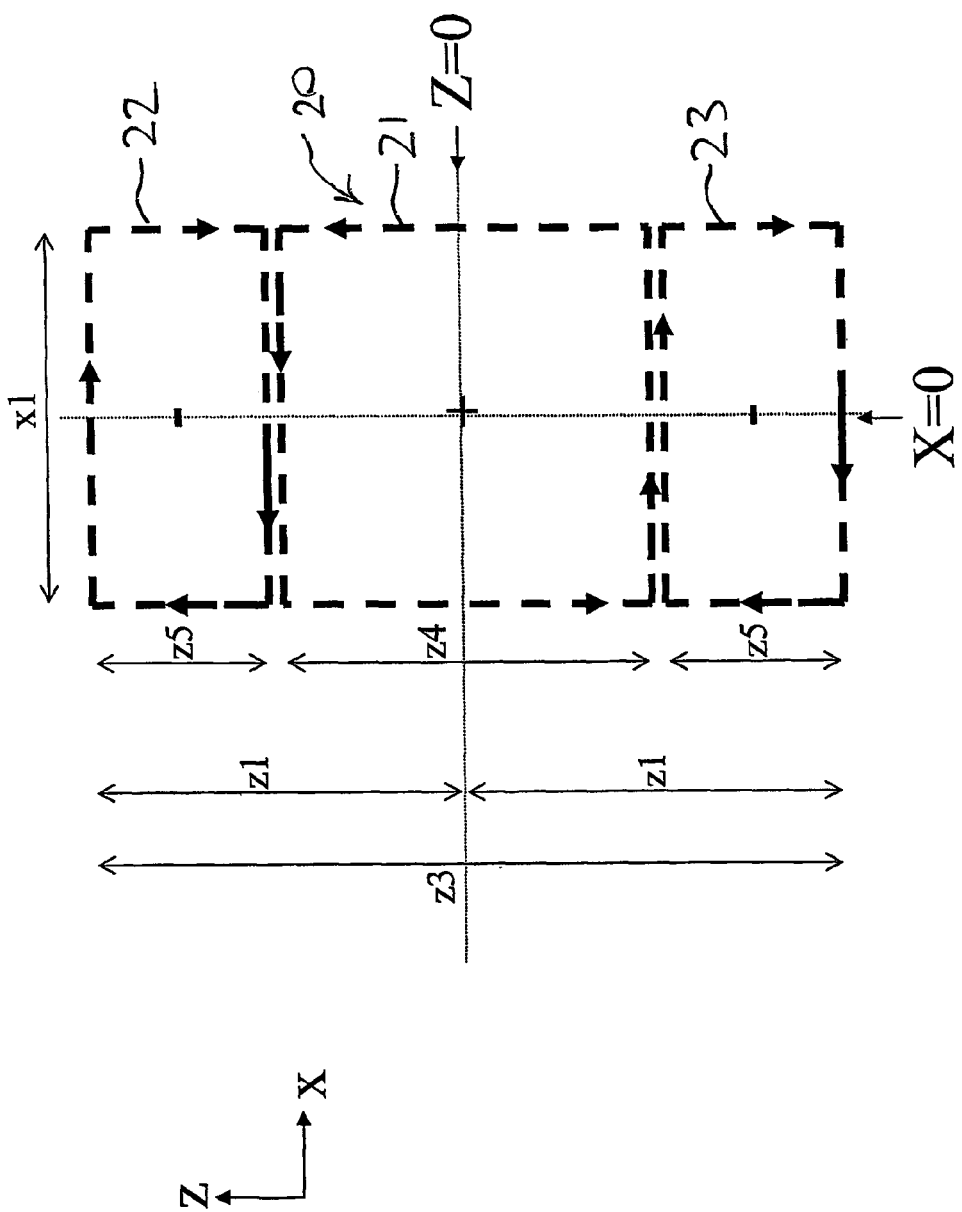
FIG. 2 is a schematic illustration of a 3 lobe twisted loop layout for use with the embodiment of FIG. 1.
Figure 3:
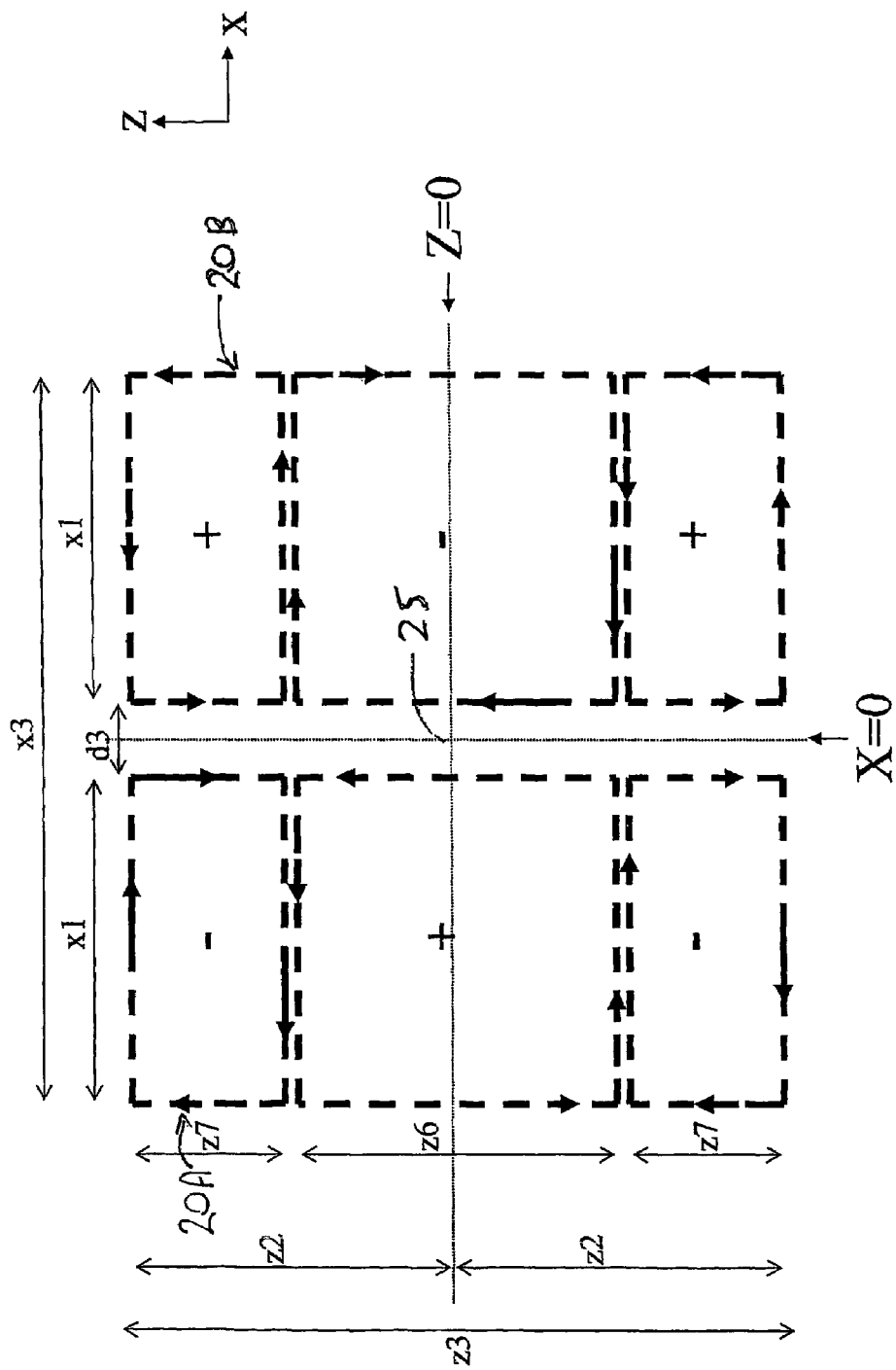
FIG. 3 is a schematic illustration of a 3-lobe twisted butterfly layout for use with the embodiment of FIG. 1.

An embodiment of this invention combines traditional loop-butterfly array elements as illustrated in FIG. 1 whose z-alignment is modified, with stacked twisted loops and twisted butterfly elements as illustrated in FIGS. 2 and 3.

In FIG. 1 is shown a conventional arrangement including a first loop 10 and a second loop 11 arranged along a longitudinal direction L and lying either side of a transverse line T forming a dividing line between the two loops. As shown the loops are spaced each from the next to define a gap 13 between the two loops. The loops are shown as being square but can be of any arbitrary shape such as circular, square, diamond, or hexagonal. The loops lie in a common plane defined by the L and T directions. The loops have dimensions in the L and T directions which are arranged to provide an optimum signal to noise ratio at the desired depth of observation. Thus the dimension in the T direction is equal to the dimension in the L direction. These loops can be used alone or can be supplemented by so called butterflies 14 and 15 which are arranged to overlie the loops 10 and 11. Thus each butterfly, as is conventionally known, comprises two lobes 16 and 17 twisted at a central area 18 so that the current flows in one direction around the loop 16 and in the opposite direction around the loop 17. Conventionally these butterflies are overlaid on the loops such that the twisted area 18 lies the middle of the loop 10. Thus the butterflies also define the gap 13 between the two separate arrays. All of the loops are selected to have the same dimensions in the plane so as to provide the same depth of optimum signal to noise ratio.

loops 10 and 11 can be used independently. The butterflies 14 and 15 can be used independently or in a third embodiment of four coil elements can be used to provide the pair in the array either side of the transverse line T.

In FIG. 2 is shown a coil element construction which is called herein a "twisted loop". The twisted loop 20 in FIG. 2 comprises a first coil 10 portion 21, a second coil portion 22 and a third coil portion 23. The coils portions 22 and 23 are twisted relative to the center coil portion 21 so that that current flows in opposite directions and so as to generate a field in opposite directions as indicated by the symbols + and −.

The dimensions of the twisted loop are arranged so that the sections 22 and 23 are generally of the order of one half of the dimension of the portion 21 in the longitudinal direction L. This ratio may vary between 40 percent and 60 percent. The total length of the three coil sections along the direction L is approximately equal to the sum of the lengths of the loops 10 and 11 in the direction L so that the outside conductors of the sections 22 and 23 generally overlie the outside conductors of the loops 10 and 11. In view of the existence of the gap 13, the conductors may not be directly aligned so that geometrical de-coupling may not be directly or accurately applied and can be compensated by traditional electronic de-coupling techniques.

However, the section of the dimensions of the central coil portion 21 to match the dimensions of the loops 10 and 11 provides again a depth of optimum signal to noise ratio at the same required position. The selection of dimension of the second loop portions 22 and 23 so that the end conductors thereof lie on the end conductors of the loops 10 and 11 if preferably arranged to provide the required geometrical de-coupling.

In the first embodiment, therefore, the twisted loop is utilized with the combination of FIG. 1 so that the twisted loop 20 is applied symmetrically along the longitudinal line L of the loops 10 and 11 with the center or first portion 21 bridging the gap 13.

In the second embodiment the twisted loop 20 is utilized with only the loops 10 and 11 without the butterflies 14 and 15.

In yet the further embodiment the twisted loop 20 can be used with only the butterflies 14 and 15 omitting the loops 10 and 11.

All of the coil elements are tuned to the same common frequency for simultaneous parallel reception of signals from a sample to be tested.

In FIG. 3 is shown a coil element construction which is called herein a "twisted butterfly". This in effect comprises two twisted loops indicated at 20A and 20B which are arranged side by side about the longitudinal directed line L. The two twisted loops 20A and 20B are twisted about a central area 25 between the two central conductors. This provides the current path as shown by the arrows extending around the various coil elements and the field arrangements as indicated by the symbols + and −. Thus the two twisted loops 20A and 20B are symmetrical but inverted one relative to the other by the twisting action at the twist point 25.

Figure 6:
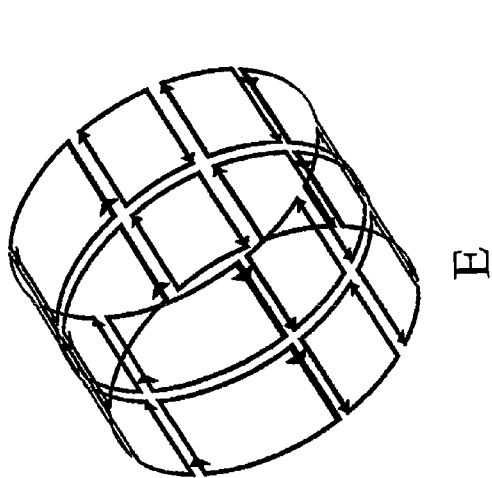
FIG. 6 illustrates a cylindrical version of a 6 by 2 volume array formed from stacking loop array elements and both longitudinal and transverse twisted loop array elements similar to the planar description of FIG. 5. (A) A layer showing a volume array of loops (B) one azimuthal section of the loop array. (C) A layer showing a volume array of longitudinally twisted elements. (D) one azimuthal element of the longitudinally twisted array. (E) A layer showing a volume array of transverse twisted elements (only three of six shown for clarity). (F) one azimuthal section of the transverse twisted array.
Figure 6:
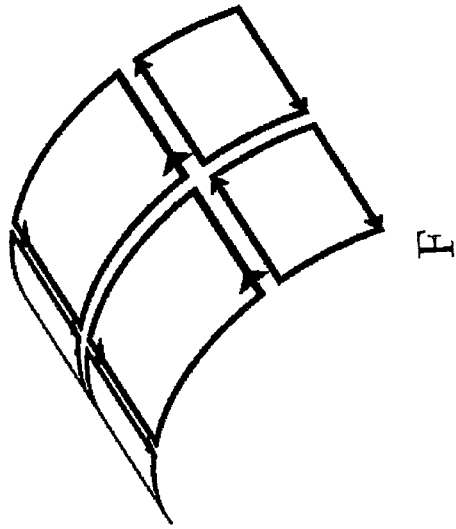
Figure 6:
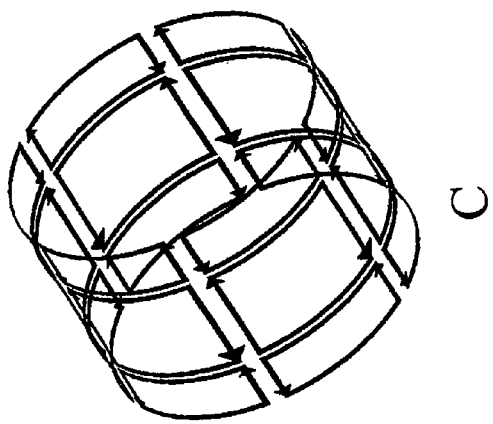
Figure 6:
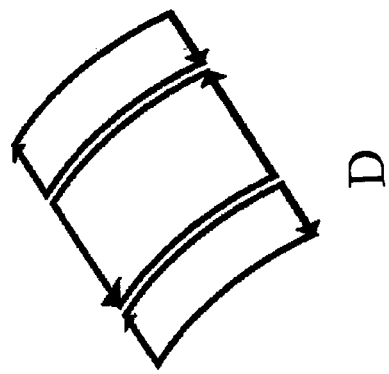
Figure 6:
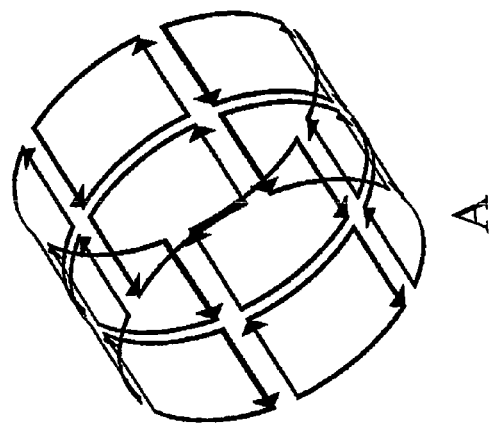
Figure 6:
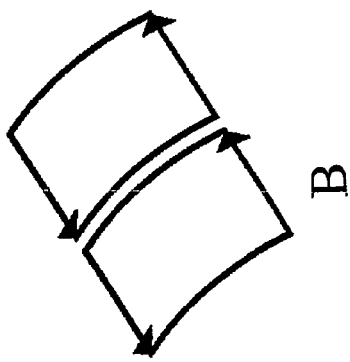

The loops may be driven in a series manner in the arrangement shown hereafter in FIG. 6. In this way a single input and output location into the conductors provides a communication of currents throughout the whole structure of the coil element. The conductors may be directly aligned or may be spaced at the twist positions as shown in regard to the central conductors at the twist point 25.

The twisted butterfly of FIG. 3 can be used preferably with the loops 10 and 11 and the butterflies 14 and 15 as an overlying array again centered on the center line of the array defined by the loops 10 and 11. Again the dimensions are selected so that geometrical de-coupling occurs.

Yet further both the twisted loop 20 of FIG. 2 and the twisted butterfly 20A, 20B of FIG. 3 can be used in conjunction with the coil elements shown in FIG. 1 to form a more complex array.

Figure 4:
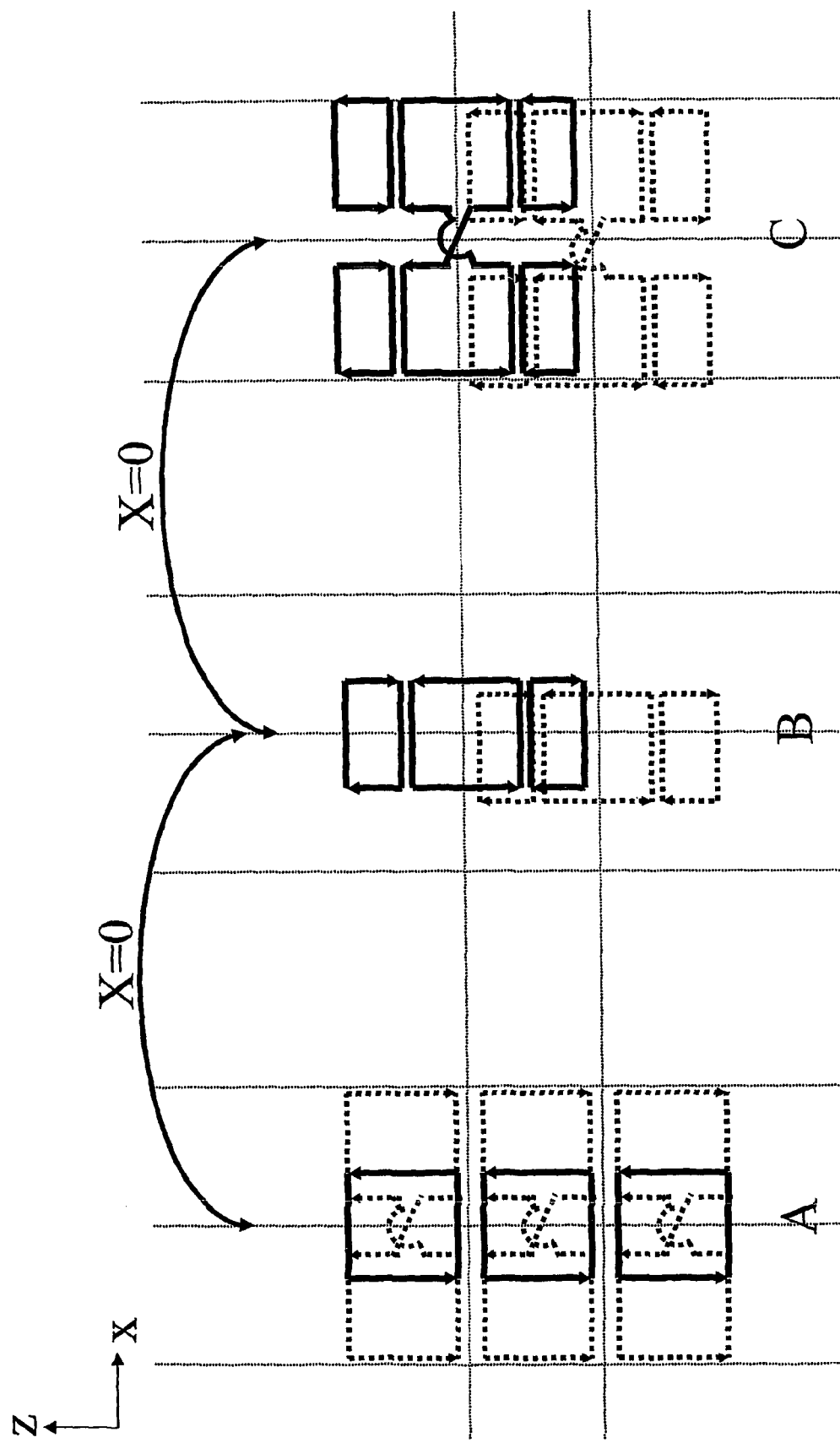
FIG. 4 illustrates (A) a one dimensional longitudinal extended Loop-Butterfly Array, (B) a one dimensional longitudinal Twisted Loop Array with the bottom element offset in x-direction for clarity, and (C) a one longitudinal Twisted Butterfly Array with the bottom element offset in x-direction for clarity.

It will be appreciated that the coil pair shown in FIG. 1 can form a base component for an array of such coil pairs. In the first embodiment the coil pairs may be arranged along longitudinally of the sample so that a series of coils are arranged along the longitudinal direction. In this case a further coil identical to the coil 11 is arranged side by side with the coil 10 on the opposite side of the coil 11. When the twisted loop is then applied onto the coils 10 and 11, this is supplemented by a further twisted loop applied onto the coils 10 and the further coil. An unlabeled schematic of this is shown in FIG. 4. Arrangements are then made to de-couple the twisted loop on the first pair and the second twisted loop on the second pair. Again this de-coupling can be arranged either geometrically or electronically as will be apparent to one skilled in the art.

It is appreciated that the longitudinal direction L does not need to be along the Z direction of the magnet and can be arranged transverse to this direction in the X direction or diagonally.

It would be further appreciated the basic array pair can be arranged to provide a complete array extending both in the longitudinal direction and the transverse direction. The longitudinal and transverse directions do not need to be at right angles if the coils are diamond shaped, circular or hexagonal.

Figure 5:
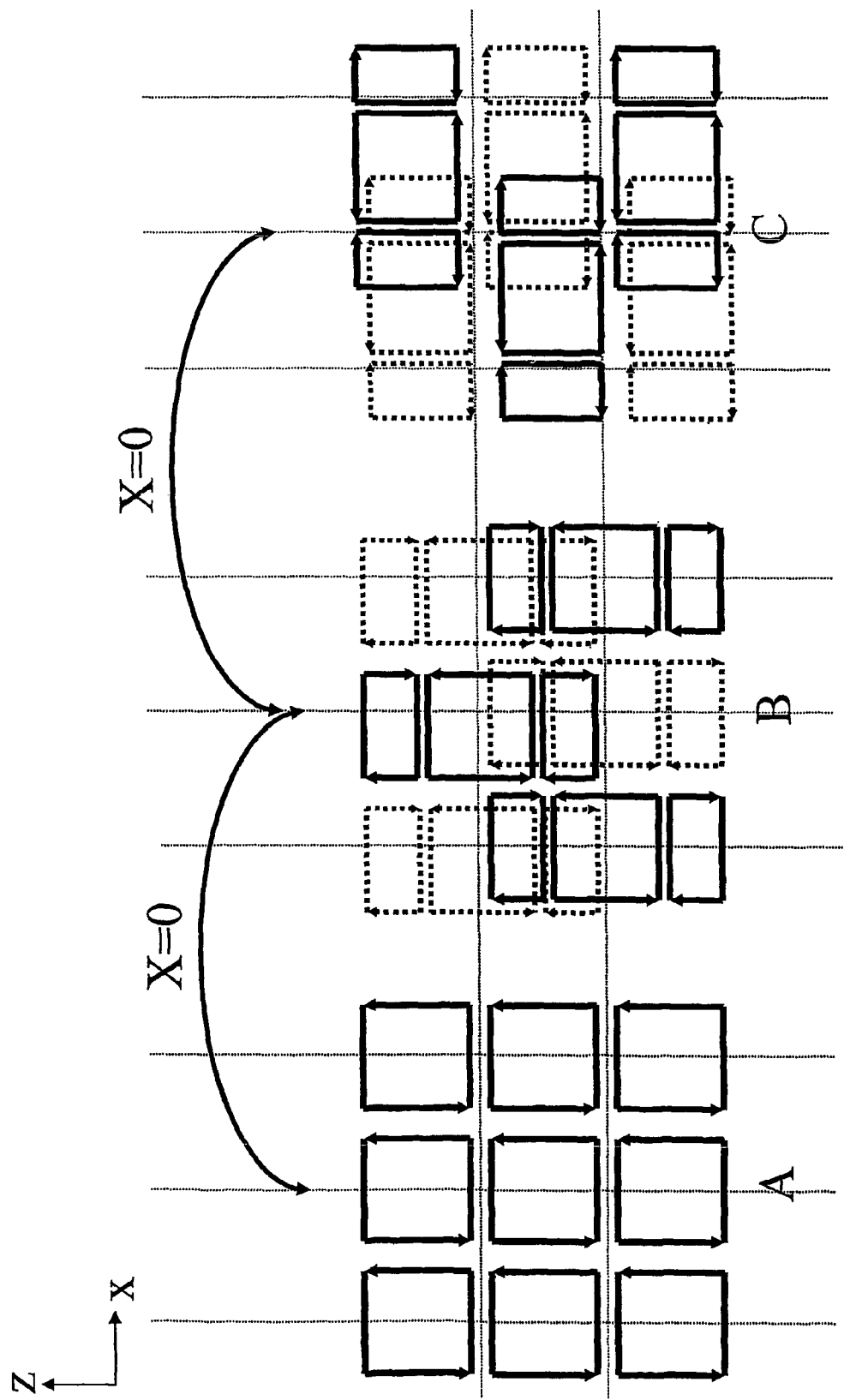
FIG. 5 illustrates (A) two dimensional transverse and longitudinal loop array, (B) two dimensional longitudinal twisted loop array with top elements offset in x-direction for clarity, (C) two dimensional transverse twisted loop array with left elements offset in z-direction for clarity.

As set forth before, in an array, each coil element which is arranged along side a next adjacent coil element forms a pair of such coil elements and utilizes a twisted loop or a twisted butterfly to provide the enhanced signal to noise ratio at the junction line between the pair. Thus where another pair is arranged along side the pair 10 and 11 in the transverse direction T, additional twisted loops will be provided between the loop 10 and its next adjacent loop and between the loop 11 and its next adjacent loop. An unlabeled schematic of this is shown in FIG. 5. Arrangements are then provided to de-couple each of the twisted loops. In this manner a complex array can be provided where the signal to noise ratio is improved at each gap between each pair and yet with separated loop elements as the building block, optimization of g-factor can be maintained and even improved with the addition of these additional orthogonal array elements, for optimized parallel MRI (SENSE/SMASH).

Referring to FIG. 4, when the first and second elements are arranged with the longitudinal direction along the x-axis, traditional butterfly elements bridging this x-axis and corresponding twisted butterfly array elements are of less value and in most cases would not be used because their B1-field would be predominantly directed in the B0-field direction of the MRI magnet.

Higher order twisting, which would result in >3 lobe twisted loops and >3 lobe twisted butterflies, is less desirable as it will generally make the individual lobes smaller and sacrifice SNR at the depth, d, but could also be used. The twisted loop and twisted butterfly are offset with respect to the loop-butterfly pair along the long axis.

The dimensions of the loop/butterfly elements of FIGS. 1, 2 and 3 are chosen for maximum SNR at a particular depth away from the coil, then significant SNR gain occurs when the size of the lobes in the twisted loops and twisted butterflies are comparable. For maximum SNR at a depth =d, the dimensions of the loop and butterfly lobes would be chosen to be $x1=x2=z1=z2\sim d$. These dimensions can vary by 10%-20% (and possibly more depending on other constraints).

As illustrated in FIG. 1 the total length of the resulting four element loop butterfly array is $z3=2(z1)=2(z2)$. As illustrated in FIG. 3, z3 should be chosen such that $z4\sim d(=z1)$ so that significant SNR gain will be achieved at depth d. For this twisted loop to be naturally decoupled from both loops of FIG. 5, z5 should be $\sim z1/2$ and the centre of the twisted loop (shown as Z=O) should be offset from the z-center of the loops of FIG. 5 by $\sim z1/2$. The twisted loop is naturally isolated from the butterfly elements due to orthogonality as long as all coil elements have the same x and y center (x=0 here) and all substantially lie in the same plane which could be flat, curved or arbitrary in shape (y=0 flat plane shown here).

As illustrated in FIG. 3, z3 should be chosen such that $z6\sim d$ ($=z2$) so that significant SNR gain will be achieved at depth d. For this twisted butterfly to be naturally decoupled from both butterflys of FIG. 5, z7 should be $\sim z2/2$ and the centre of the twisted butterfly (shown as Z=0) should be offset from the z-center of the butterflys of FIG. 5 by $\sim z2/2$. The twisted butterfly is naturally isolated from the loop and twisted loop elements due to orthogonality as long as all coil elements have the same x center (x=0 here) and all substantially lie in the same plane which could be flat, curved or arbitrary in shape (y=0 flat plane shown here).

Each of the coil elements (6 in this case) are then connected to separate preamplifiers (which may be of the low input impedance type) and then separate receivers. The MRI console would then reconstruct the phased array image into a single composite image with appropriate weighting of the images from these individual coil elements (6 in this example). Alternatively, signals from these array elements can be combined together in hardware to reduce the number of receivers required. This combination could be done before or after pre-amplification.

It is understood that the geometry of the coils could also be circular, hexagonal, rectangular, or diamond shapes or variations thereof. These variations would include more complex structures such as ladder networks which provide greater than one parallel current paths normally for extended and more uniform B1-field distributions. Also, concentric multi-ring surface coil elements with co- or counter-rotating currents would also be a suitable variant. Furthermore, although the embodiment chosen to explain the invention is a surface array, the invention could also be applied to volume coils such as illustrated in FIG. 6.

It should be appreciated that when there are significant gaps between loop elements as shown in FIG. 4a and FIG. 5a, the size of the twisted loops and twisted butterfly elements would be adjusted accordingly to achieve geometrical decoupling. That is, the lobe/section sizes labelled as 21,22,23 would be adjusted as well as the gap between these lobes/sections could also be adjusted for decoupling. In order to provide the decoupling of the third or fourth coil elements geometrically, it is preferable that the second and third coil sections and the gap between these sections and the first section are dimensioned in the longitudinal direction such that the sum of the lengths of the first, second and third coil sections and the respective section gaps is substantially equal to the sum of the lengths of the first and second coil elements in the longitudinal direction including the gap between these first and second elements.

However conventionally known decoupling techniques such as shared inductance or shared capacitance well known to one skilled in the art can be used to supplement geometrical techniques if the geometry is compromised due to the particularly design of the coil elements.

Figure 7:
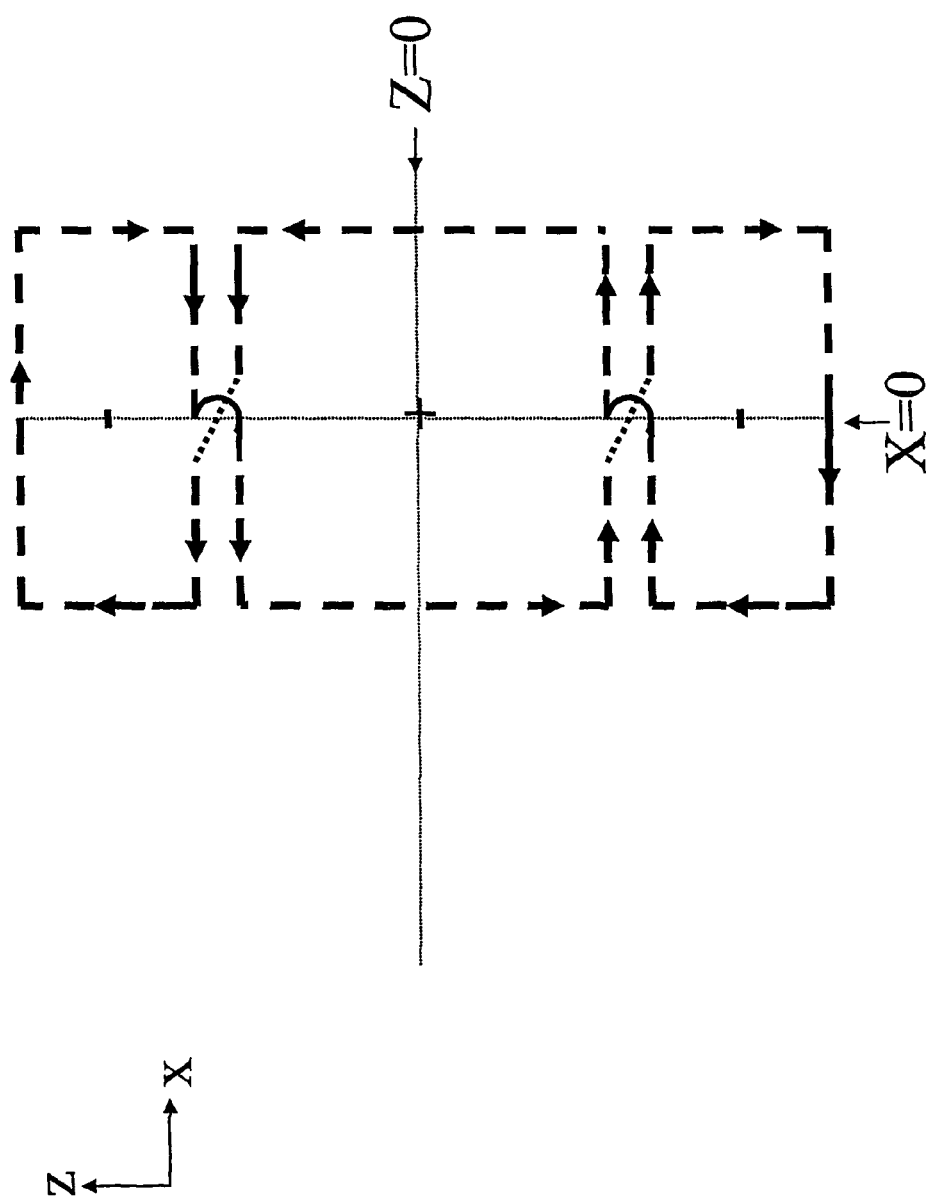
FIG. 7 illustrates a series method of the conductor layout and current pattern for forming the coil element of FIG. 2
Figure 8:
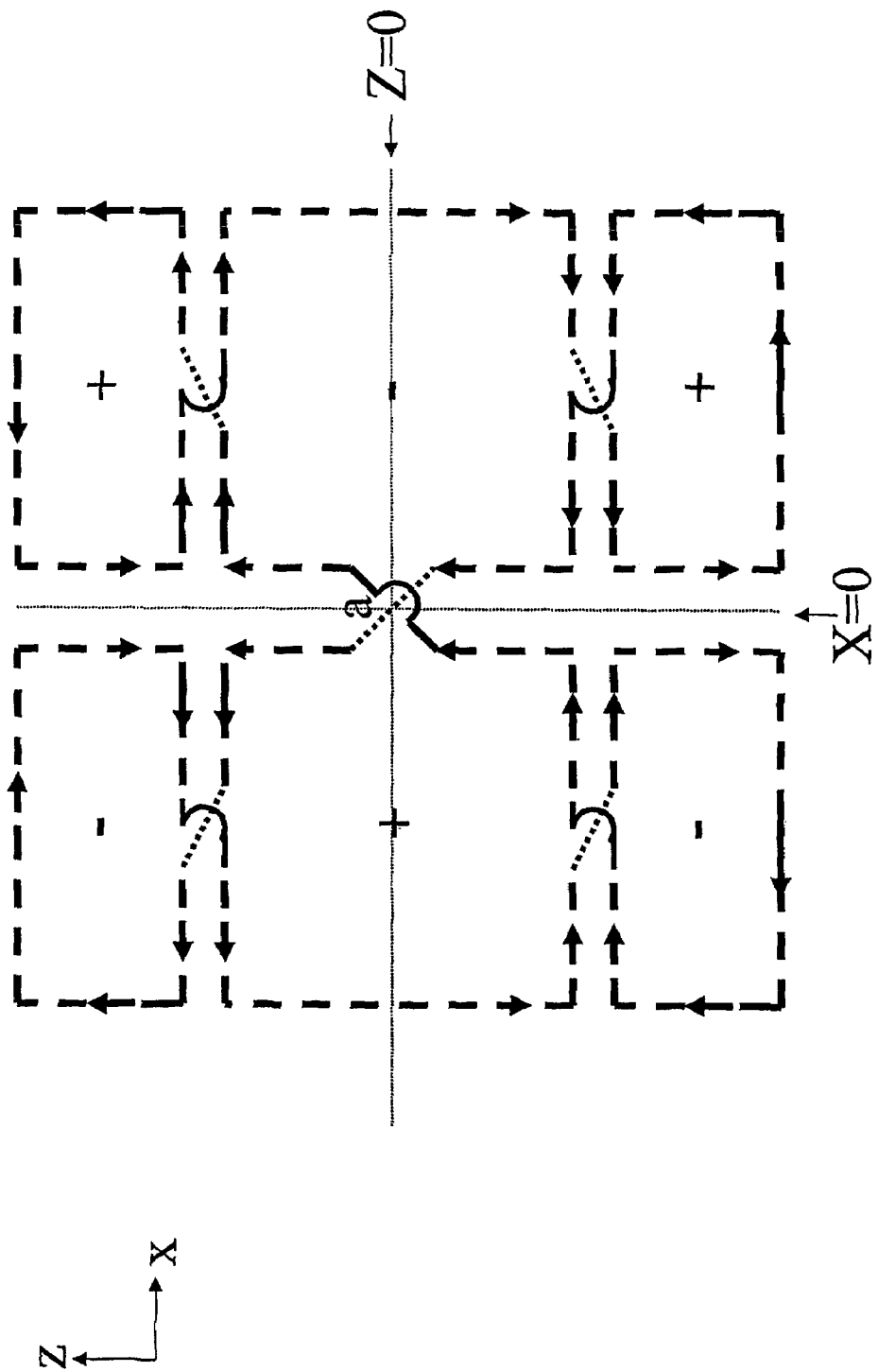
FIG. 8 illustrates a series method of the conductor layout and current pattern for forming the coil element of FIG. 3

It should be appreciated by someone trained in the art that the lobe/section current pathways described herein can be achieved in several different ways as know by those trained in the art. A first method would be to connect lobe/sections in a series fashion, requiring a cross connection between each lobe/section. This is the method used in FIG. 7 and FIG. 8. Alternatively, this cross connection could be eliminated and the current pathways could be ensured by allowing the mutual inductive coupling of each lobe/section to set up a mode where currents are flowing in the correct direction relative to other lobes/sections ensuring correct B1-field polarizations for each lobe/section.

Someone trained in the art would also recognize that such array elements could be driven in several different ways. These include direct capacitive coupling with a coaxial cable. This can be done in a series fashion or in parallel at one of the cross connection points. Although not a preferred embodiment, alternatively, an inductive coupling method could be used to couple to each element.

RESULTS

Figure 9:
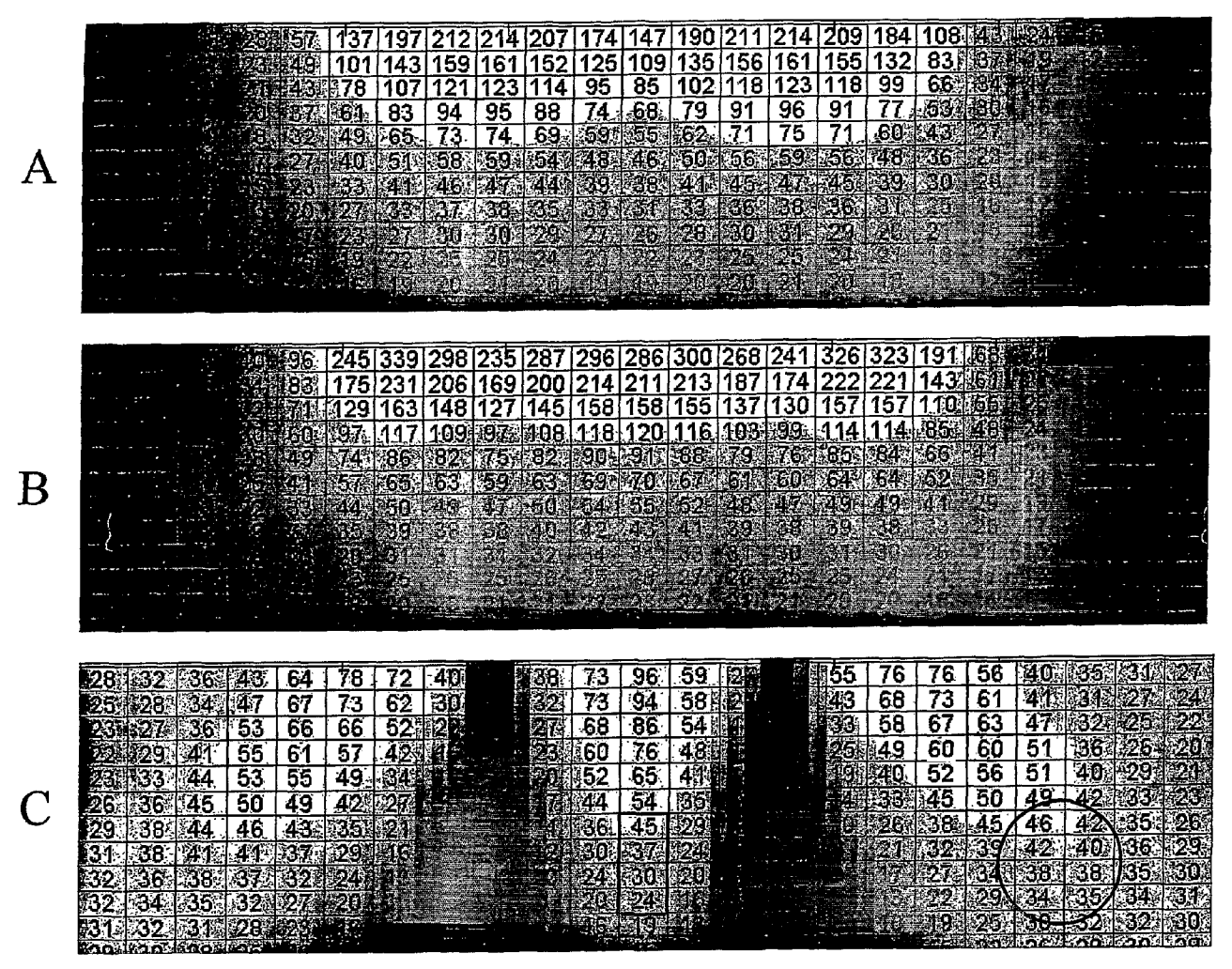

By superimposing one twisted loop and one twisted butterfly on a four element loop butterfly surface array of desired dimensions and symmetry, long axis sum-of-squares SNR (FIG. 9B) gains at the depth of interest of 24%-45% can be achieved between loop-butterfly elements and 35%-45% (as shown in FIG. 9C) at the longitudinal ends of the array. FIG. 9A shows the sum-of-squares SNR of the four element loop butterfly surface array.

various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A coil array for use in magnetic resonance experiments on a sample to be tested comprising:
   a plurality of coil elements tuned to a common frequency for simultaneous parallel reception of signals from a sample to be tested or alternatively in transmission for excitation of a sample to be tested;
   the coil elements including a first and a second coil elements each having coil dimensions selected and arranged to provide for the coil elements a predetermined depth from the coil of optimum operation within the sample to be tested;
   the first and second coil elements being placed side by side along a longitudinal direction so as to define, at a line transverse to the longitudinal direction, a rear edge of the first coil which is adjacent to a front edge of the second coil with the front edge of the second coil being separate from the rear edge of the first coil;
   the coil elements including a third coil element having a first coil section, a second coil section and a third coil section arranged such that:
      the first coil section is arranged at a location bridging the transverse line;
      the second coil section is arranged at a side of the first coil section remote from said transverse line and the third coil section is arranged at a side of the first coil section remote from said transverse line and opposite to said second coil section;
      the first coil section has coil dimensions selected and arranged to provide for the first coil section a depth from the coil of optimum operation within the sample to be tested substantially equal to the predetermined optimum depth of the first and second coil elements;
      the second and third coil sections are twisted relative to the first coil section and arranged such that the current therein rotates in direction opposite to that of the first coil section;
   the third coil element being dimensioned and arranged such that it is de-coupled from the first and second coil elements.

2. The coil array according to claim 1 wherein the second and third coil sections are dimensioned in the longitudinal direction such that the sum of the lengths of the first second and third coil sections is substantially equal to the sum of the lengths of the first and second coil elements in the longitudinal direction.

3. The coil array according to claim 1 wherein the first and second coil elements are spaced in the longitudinal direction so as to improve parallel MRI performance through optimized g-factor.

4. The coil array according to claim 1 wherein there is provided a further longitudinal coil element having coil dimensions selected and arranged to provide for the further coil element the same predetermined depth from the coil of optimum operation within the sample to be tested, the further coil element being arranged such that the first and further coil elements are placed side by side along a longitudinal direction so as to define a line transverse to the longitudinal direction which is between the first and further coil elements and wherein there is provided an additional bridging coil element having a first coil section, a second coil section and a third coil section arranged such that:

the first coil section is arranged at a location bridging the transverse line between the first and further coil elements;

the second coil section is arranged at a side of the first coil section remote from said transverse line and the third coil section is arranged at a side of the first coil section remote from said transverse line and opposite to said second coil section;

the first coil section has coil dimensions selected and arranged to provide for the first coil section a depth from the coil of optimum operation within the sample to be tested substantially equal to the predetermined optimum depth of the first and second coil elements;

the second and third coil sections are twisted relative to the first coil section and arranged such that the current therein rotates in direction opposite to that of the first coil section;

the additional coil element being dimensioned and arranged such that it is de-coupled from the first and further coil elements.

5. The coil array according to claim 1 wherein there is provided a further transverse coil element having coil dimensions selected and arranged to provide for the further coil element the same predetermined depth from the coil of optimum operation within the sample to be tested, the further transverse coil element being arranged such that the first and further transverse coil elements are placed side by side along a transverse direction so as to define a dividing line generally along the longitudinal direction which is between the first and further coil elements and wherein there is provided an additional bridging coil element having a first coil section, a second coil section and a third coil section arranged such that:

the first coil section is arranged at a location bridging the dividing line;

the second coil section is arranged at a side of the first coil section remote from said dividing line and the third coil section is arranged at a side of the first coil section remote from said dividing line and opposite to said second coil section;

the first coil section has coil dimensions selected and arranged to provide for the first coil section a depth from the coil of optimum operation within the sample to be tested substantially equal to the predetermined optimum depth of the first and second coil elements;

the second and third coil sections are twisted relative to the first coil section and arranged such that the current therein rotates in direction opposite to that of the first coil section;

the additional coil element being dimensioned and arranged such that it is de-coupled from the first and further coil elements.

6. The coil array according to claim 1 wherein the first and second coil elements are loops.

7. The coil array according to claim 1 wherein the third coil element is stacked on the first and second coil elements so as to have substantially the same width along the transverse line and to be substantially aligned therewith.

8. The coil array according to claim 1 wherein the first and second coil elements are each formed from first and second coil sections arranged side by side along the transverse line where the second coil section is twisted relative to the first coil section such that the current therein rotates in direction opposite to that of the first coil section.

9. The coil array according to claim 1 wherein there are provided fourth and fifth coil elements each stacked on a respective one of the first and second coil elements respectively and each formed from first and second coil sections arranged side by side along the transverse line where the second coil section is twisted relative to the first coil section such that the current therein rotates in direction opposite to that of the first coil section.

10. The coil array according to claim 1 wherein the third coil element has a fourth coil section, a fifth coil section and a sixth coil section arranged such that:

the fourth coil section is arranged at a location bridging the transverse line and aligned side by side with the first coil section;

the fifth coil section is arranged at a side of the fourth coil section remote from said transverse line and side by side with the second coil section;

the sixth coil section is arranged at a side of the fourth coil section remote from said transverse line and opposite to said fifth coil section and side by side with the third coil section;

the fourth coil section has coil dimensions selected and arranged to provide for the fourth coil section a depth from the coil of optimum operation within the sample to be tested substantially equal to the predetermined optimum depth of the first and second coil elements;

the fifth and sixth coil sections are dimensioned in the longitudinal direction such that the sum of the lengths of the fourth, fifth and sixth coil sections is substantially equal to the sum of the lengths of the first and second coil elements in the longitudinal direction;

the fifth and sixth coil sections are twisted relative to the fourth coil section and arranged such that the current therein rotates in direction opposite to that of the fourth coil section;

the first, second and third coil sections are twisted relative to the fourth, fifth and sixth coil sections such that the current therein rotates in direction opposite to that of the first, second and third coil sections respectively such that the third coil element is de-coupled from the first and second coil elements.

11. The coil array according to claim 1 wherein there is provided a fourth coil element;

wherein the fourth coil element has a first coil section, a second coil section and a third coil section arranged such that:

the first coil section is arranged at a location bridging the transverse line;

the second coil section is arranged at a side of the first coil section remote from said transverse line and the third coil section is arranged at a side of the first coil section remote from said transverse line and opposite to said second coil section;

the first coil section has coil dimensions selected and arranged to provide for the first coil section a depth from the coil of optimum operation within the sample to be tested substantially equal to the predetermined optimum depth of the first and second coil elements;

the second and third coil sections are twisted relative to the first coil section and arranged such that the current therein rotates in direction opposite to that of the first coil section;

the third coil element being dimensioned and arranged such that it is de-coupled from the first and second coil elements);

and wherein the fourth coil element has a fourth coil section, a fifth coil section and a sixth coil section arranged such that:

the fourth coil section is arranged at a location bridging the transverse line and aligned side by side with the first coil section;

the fifth coil section is arranged at a side of the fourth coil section remote from said transverse line and side by side with the second coil section;

the sixth coil section is arranged at a side of the fourth coil section remote from said transverse line and opposite to said fifth coil section and side by side with the third coil section;

the fourth coil section has coil dimensions selected and arranged to provide for the fourth coil section a depth from the coil of optimum operation within the sample to be tested substantially equal to the predetermined optimum depth of the first and second coil elements;

the fifth and sixth coil sections are dimensioned in the longitudinal direction such that the sum of the lengths of the fourth, fifth and sixth coil sections is substantially equal to the sum of the lengths of the first and second coil elements in the longitudinal direction;

the fifth and sixth coil sections are twisted relative to the fourth coil section and arranged such that the current therein rotates in direction opposite to that of the fourth coil section;

the first, second and third coil sections are twisted relative to the fourth, fifth and sixth coil sections such that the current therein rotates in direction opposite to that of the first, second and third coil sections respectively such that the fourth coil element is de-coupled from the first and second and third coil elements.

* * * * *